(12) United States Patent
Nguyen et al.

(10) Patent No.: US 6,756,318 B2
(45) Date of Patent: Jun. 29, 2004

(54) NANOLAYER THICK FILM PROCESSING SYSTEM AND METHOD

(75) Inventors: Tue Nguyen, Fremont, CA (US); Tai Dung Nguyen, Fremont, CA (US)

(73) Assignee: Tegal Corporation, Petaluma, CA (US)

( * ) Notice: Subject to any disclaimer, the term of this patent is extended or adjusted under 35 U.S.C. 154(b) by 205 days.

(21) Appl. No.: 09/954,244

(22) Filed: Sep. 10, 2001

(65) Prior Publication Data

US 2003/0049375 A1 Mar. 13, 2003

(51) Int. Cl.$^7$ .............................................. H01L 21/31
(52) U.S. Cl. ...................... 438/758; 427/255; 438/627
(58) Field of Search ................................ 438/758, 627, 438/643, 653, 674, 678, 687, 787, 770; 427/255, 569

(56) References Cited

U.S. PATENT DOCUMENTS

| | | | |
|---|---|---|---|
| 5,468,341 A | | 11/1995 | Samukawa |
| 5,871,811 A | * | 2/1999 | Wang et al. ............. 427/248.1 |
| 5,916,365 A | | 6/1999 | Sherman |
| 6,200,893 B1 | | 3/2001 | Sneh |
| 6,492,283 B2 | * | 12/2002 | Raaijmakers et al. ........ 438/770 |
| 6,534,395 B2 | * | 3/2003 | Werkhoven et al. ......... 438/627 |
| 2003/0082296 A1 | * | 5/2003 | Elers et al. .................... 427/96 |

FOREIGN PATENT DOCUMENTS

WO   WO 00/79019 A1   12/2000

OTHER PUBLICATIONS

Data sheet for plasma power supply (RFG 3000W, 13.56 MHz, CE Power Supplies).
Data sheet for plasma matching network (Matchwork 10D).
Tech note 34: "Impedance Matching".
Tech note 33: "Introducing Power Supplies and Plasma Systems".
"The evolution of RF power delivery in plasma processing" by R. Heckman, G. Roche, J. R. Usher.
"Effect of Ion Bombardment during Chemical Vapor Deposition of TiN Films" by K.–C. Kim et al., J. Electrochem. Soc. 147 (7)2711 (2000).

* cited by examiner

Primary Examiner—John F. Niebling
Assistant Examiner—Olivia Luk
(74) Attorney, Agent, or Firm—Fliesler Meyer LLP

(57) ABSTRACT

A process to deposit a thin film by chemical vapor deposition includes evacuating a chamber of gases; exposing a device to a gaseous first reactant, wherein the first reactant deposits on the device to form the thin film having a plurality of monolayers in thickness; evacuating the chamber of gases; exposing the device, coated with the first reactant, to a gaseous second reactant under a plasma treatment, wherein the thin film is treated by the first reactant; and repeating the previous steps.

20 Claims, 14 Drawing Sheets

300

NANOLAYER THICK FILM PROCESSING SYSTEM AND METHOD

BACKGROUND

The present invention relates to semiconductor thin film processing. The fabrication of modern semiconductor device structures has traditionally relied on plasma processing in a variety of operations such as etching and deposition. Plasma etching involves using chemically active atoms or energetic ions to remove material from a substrate. Deposition techniques employing plasma includes Chemical Vapor Deposition (CVD) and Physical Vapor Deposition (PVD) or sputtering. PVD uses a high vacuum apparatus and generated plasma that sputters atoms or clusters of atoms toward the surface of the wafer substrates. PVD is a line of sight deposition process that is more difficult to achieve conform film deposition over complex topography such as deposition of a thin and uniform liner or barrier layer over the small trench or via of 0.13 $\mu$m or less, especially with high aspect ratio greater than 4:1.

In CVD, a gas or vapor mixture is flowed over the wafer surface at an elevated temperature. Reactions then take place at the hot surface where deposition takes place. Temperature of the wafer surface is an important factor in CVD deposition, as it depends on the chemistry of the precursor for deposition and affects the uniformity of deposition over the large wafer surface. CVD typically requires high temperature for deposition which may not be compatible with other processes in the semiconductor process. CVD at lower temperature tends to produce low quality films in term of uniformity and impurities. More details on PVD and CVD are discussed in International Pub. Number WO 00/79019 A1 or PCT/US00/17202 to Gadgil, the content of which is incorporated by reference.

In a deposition technology known as atomic layer deposition (ALD), various gases are injected into the chamber for as short as 100–500 milliseconds in alternating sequences. For example, a first gas is delivered into the chamber for about 500 milliseconds and the substrate is heated, then the first gas (heat optional) is turned off. Another gas is delivered into the chamber for another 500 milliseconds (heat optional) before the gas is turned off. The next gas is delivered for about 500 milliseconds (and optionally heated) before it is turned off. This sequence is done for until all gases have been cycled through the chamber, each gas sequence forming a monolayer which is highly conformal. ALD technology thus pulses gas injection and heating sequences that are between 100 and 500 milliseconds. This approach has a high dissociation energy requirement to break the bonds in the various precursor gases such as silane and oxygen and thus requires the substrate to be heated to a high temperature, for example in the order of 600–800 degree Celsius for silane and oxygen processes.

U.S. Pat. No. 5,916,365 to Sherman entitled "Sequential chemical vapor deposition" provides for sequential chemical vapor deposition by employing a reactor operated at low pressure, a pump to remove excess reactants, and a line to introduce gas into the reactor through a valve. Sherman exposes the part to a gaseous first reactant, including a non-semiconductor element of the thin film to be formed, wherein the first reactant adsorbs on the part. The Sherman process produces sub-monolayers due to adsorption. The first reactant forms a monolayer on the part to be coated (after multiple cycles), while the second reactant passes through a radical generator which partially decomposes or activates the second reactant into a gaseous radical before it impinges on the monolayer. This second reactant does not necessarily form a monolayer but is available to react with the monolayer. A pump removes the excess second reactant and reaction products completing the process cycle. The process cycle can be repeated to grow the desired thickness of film.

U.S. Pat. No. 6,200,893 to Sneh entitled "Radical-assisted sequential CVD" discusses a method for CVD deposition on a substrate wherein radical species are used in alternate steps to depositions from a molecular precursor to treat the material deposited from the molecular precursor and to prepare the substrate surface with a reactive chemical in preparation for the next molecular precursor step. By repetitive cycles a composite integrated film is produced. In a preferred embodiment the depositions from the molecular precursor are metals, and the radicals in the alternate steps are used to remove ligands left from the metal precursor reactions, and to oxidize or nitride the metal surface in subsequent layers.

In one embodiment taught by Sneh, a metal is deposited on a substrate surface in a deposition chamber by (a) depositing a monolayer of metal on the substrate surface by flowing a molecular precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing at least one radical species into the chamber and over the surface, the radical species highly reactive with the surface ligands of the metal precursor layer and eliminating the ligands as reaction product, and also saturating the surface, providing the first reactive species; and (e) repeating the steps in order until a metallic film of desired thickness results.

In another Sneh aspect, a metal nitride is deposited on a substrate surface in a deposition chamber by (a) depositing a monolayer of metal on the substrate surface by flowing a metal precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing a first radical species into the chamber and over the surface, the atomic species highly reactive with the surface ligands of the metal precursor layer and eliminating the ligands as reaction product and also saturating the surface; (e) flowing radical nitrogen into the chamber to combine with the metal monolayer deposited in step (a), forming a nitride of the metal; (f) flowing a third radical species into the chamber terminating the surface with the first reactive species in preparation for a next metal deposition step; and (g) repeating the steps in order until a composite film of desired thickness results.

The Sneh embodiments thus deposit monolayers, one at a time. This process is relatively time-consuming as a thick film is desired.

In comparison with CVD, atomic layer deposition (ALD or ALCVD) is a modified CVD process that is temperature sensitive and flux independent. ALD is based on self-limiting surface reaction. ALD provides a uniform deposition over complex topography and temperature independent since the gases are adsorbed onto the surface and lower temperature than CVD because it is in adsorption regime. As discussed in Sherman and Sneh, the ALD process includes cycles of flowing gas reactant into the chamber, adsorbing one sub-monolayer onto the wafer surface, purging the gas reactant, flowing a second gas reactant into the chamber, and reacting the second gas reactant with the first gas reactant to form a monolayer on the wafer substrate. Thick film is achieved by deposition of multiple cycles.

Precise thickness can be controlled by number of cycles since monolayer is deposited per cycle. However, the conventional ALD method is slow in depositing films such as those around 100 angstroms in thickness. Growth rate of ALE TiN for example was reported at 0.2 angstrom/cycle, which is typical of metal nitrides from corresponding chlorides and $NH_3$.

The throughput in device fabrication for a conventional ALD system is slow. Even if the chamber is designed with minimal volume, the throughput is still slow due to the large number of cycles required to achieve the thickness. Conventional ALD is a slower process than CVD with a rate of deposition almost 10 times as slow as CVD deposition. The process is also chemical dependent to have the proper self-limiting surface reaction for deposition.

SUMMARY

In one aspect, a process of depositing a thin film by chemical vapor deposition includes evacuating a chamber of gases; exposing a device to a gaseous first reactant, wherein the first reactant deposits on the device to form the thin film; evacuating the chamber of gases; and exposing the device, coated with the first reactant, to a gaseous second reactant under plasma, wherein the thin film deposited by the first reactant is treated to form the same materials or a different material.

Implementations of the above aspect may include one or more of the following. The device can be a wafer. The plasma enhances or maintains the thin film conformality. The plasma can be a high density plasma with higher than $5 \times 10^9$ ion/cm$^3$. The reactant can be a metal organic, organic, to form a thin film of metal, metal nitride, or metal oxide. The second reactant is exposed under high pressure above 100 mT. The first and second reactants react and the reaction creates a new compound. The thin film thickness is more than one atomic layer thickness. The thin film thickness can be between a fraction of a nanometer and tens of nanometers. The plasma can be sequentially pulsed for each layer to be deposited. The plasma can be excited with a solid state RF plasma source such as a helical ribbon electrode. The chamber containing the device can be purged. The process includes pre-cleaning a surface of a device; evacuating a chamber; stabilizing precursor flow and pressure; exposing the device to a first reactant, wherein the first reactant deposits on the device to form the nanolayer thin film having a thickness of more than one atomic layer; purging the chamber; evacuating the chamber; striking the plasma; performing a plasma treatment on the deposited film; exposing the device, coated with the first reactant, to a gaseous second reactant under the plasma treatment, wherein the thin film deposited by the first reactant is treated to form the same materials or a different material. Repeating of the nanolayer deposition steps deposit a thick film with thickness controlled by the number of repeats.

In another aspect, the deposition steps discussed above can take place in multiple chambers. The process includes pre-cleaning of the device surface, evacuating the chamber, stabilizing precursor flow and pressure, exposing the device to a first reactant, wherein the first reactant deposits on the device to form the nanolayer thin film having a thickness of more than one atomic layer, purging the chamber, evacuating the chamber; then the device is transferred to another chamber that is purged and pumped, then striking the plasma, performing a plasma treatment on the deposited film, exposing the device, coated with the first reactant in the first chamber, to a gaseous second reactant under the plasma treatment in the second chamber, wherein the thin film deposited by the first reactant is treated to form the same materials or a different material. Repeating of the nanolayer deposition steps between the first and second chambers deposit a thick film with thickness controlled by the number of repeats.

In another aspect, an apparatus to perform semiconductor processing includes a high density inductive coupled plasma generator to generate plasma; and a process chamber housing the plasma generator, wherein the chamber exposes a device to a gaseous first reactant, wherein the first reactant deposits on the device to form the thin film and, after purging, exposes the device, coated with the first reactant, to a gaseous second reactant under plasma, wherein the thin film deposited by the first reactant is treated to form the same materials or a different material. The method can provide deposition of copper metal from Cu hfacI and plasma (gas), Cu hfacII and plasma (gas), $CuI_4$ and plasma (gas), $CuCl_4$ and plasma (gas), and organo metallic and plasma (gas); of titanium nitride from TDMAT and plasma (gas), TDEAT and plasma (gas), TMEAT and plasma (gas), $TiCl_4$ and plasma (gas), $TiI_4$ and plasma (gas), and organo metallic and plasma (gas); of tantalum nitride from PDMAT and plasma (gas), PDEAT and plasma (gas), and organo metallic and plasma (gas); wherein gas is one of $N_2$, $H_2$, Ar, He, $NH_3$, and combination thereof.

Implementations of the apparatus can include gas distribution, chuck, vaporizer, pumping port to pump, and port for gas purge.

Advantages of the system may include one or more of the followings. The resulting deposition is highly conformal and is similar in quality to that of atomic layer deposition. The nanolayer thick film deposition process provides almost 100% conformal deposition on complex topography as that in semiconductor devices having 0.1 micron width with an aspect ratio greater than 8:1. Excellent conformality of film is achieved with NLD similar to that of ALD, and far superior than conformality of thick CVD film. Further, such conformality is achieved at high speed since multiple atomic layers are deposited at once, in contrast to conventional monolayer deposition techniques such as atomic layer deposition technique. In each cycle of NLD process, a film with thickness of more than a monolayer to a few nanometers is deposited. The advantage of NLD over ALD is thus throughput is higher than that of ALD, since multiple atomic layers are deposited in contrast to ALD.

The microstructure of the film resulting from NLD can be of a nanocrystalline grain structure in an amorphous matrix using the NLD technique, since a film of more than a monolayer to a few nanometer thick is deposited in each cycle. This structure is not typical of conventional CVD or PVD processes. The surface morphology of the films deposited by NLD technique is also smoother than that of films deposited by the conventional CVD technique. This microstructure and morphology can be ideal for certain applications. In the application of copper diffusion barrier thin film deposition, this microstructure of the barrier thin film is a key to the resistance to copper. In fact, our initial data show that our NLD TiN film deposited from TDMAT precursor and $N_2$ plasma has superior barrier properties to PVD TiN, PVD TaN, or conventional CVD TiN. Additionally, the low temperature of the NLD deposition process (lower than CVD) is consistent with the processing requirements of advanced films such as low-k dielectric.

The precursors or gases in NLD process are not limited to only those having the self-limiting surface reactions since NLD is a deposition process. NLD thus is precursor-dependent and can be used to deposit a vast number of film materials from currently available precursors. Since NLD process has high throughput, the minimal volume constraint as in ALD process is not necessary, and conventional CVD chamber can be used to achieve highly conformal, high quality, high throughput films.

Other advantages of the system may include one or more of the followings. The helical ribbon provides a highly uniform plasma and also results in a chamber with a small volume. The system enables high precision etching, deposition or sputtering performance. This is achieved using the pulse modulation of a radio frequency powered plasma source, which enables a tight control the radical production ratio in plasmas, the ion temperature and the charge accumulation. Also, since the time for accumulation of charges in a wafer is on the order of milli-seconds, the accumulation of charges to the wafer is suppressed by the pulse-modulated plasma on the order of micro-seconds, and this enables the suppression of damage to devices on the wafer caused by the charge accumulation and of notches caused during the electrode etching process. The system requires that the substrate be heated to a relatively low temperature such as 400 degrees Celsius.

Yet other advantages may include one or more of the followings. The system attains highly efficient plasma operation in a compact substrate process module that can attain excellent characteristics for etching, depositing or sputtering of semiconductor wafers as represented by high etch rate, high uniformity, high selectivity, high anisotropy, and low damage. The system achieves high density and highly uniform plasma operation at low pressure for etching substrates and for deposition of films on to substrates. Additionally, the system is capable of operating with a wide variety of gases and combinations of gases, including highly reactive and corrosive gases.

DESCRIPTION

Figure 1A:
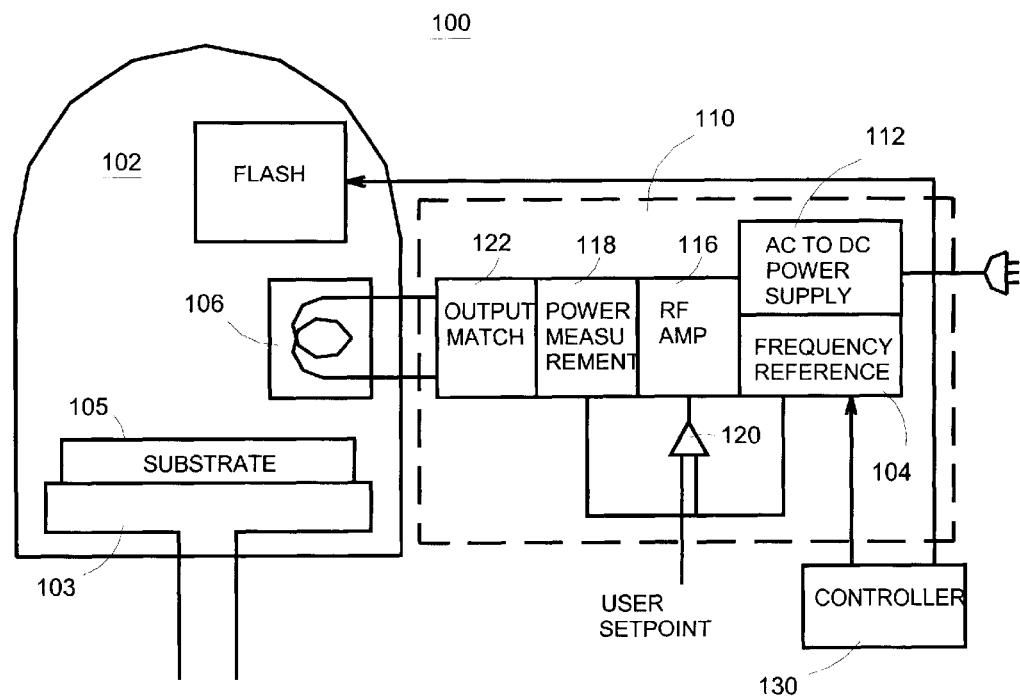
FIGS. 1A–1E show exemplary embodiments of a plasma processing system with a helical ribbon.

FIG. 1A shows an exemplary plasma processing system 100 with a processing chamber 102. The process chamber 102 has a chamber body enclosing components of the process chamber such as a chuck 103 supporting a substrate 105. The process chamber typically maintains vacuum and provides a sealed environment for process gases during substrate processing. On occasions, the process chamber needs to be periodically accessed to cleanse the chamber and to remove unwanted materials cumulating in the chamber. To support maintenance for the process chamber, an opening is typically provided at the top of the process chamber that is sufficiently large to provide access to the internal components of the process chamber.

The chamber 102 includes a plasma excitation circuit 106 driven by a solid-state plasma generator 110 with fast ignition capability. One commercially available plasma source is the Litmas source, available from LITMAS Worldwide of Matthews, N.C. The generator 110 includes a switching power supply 112 that is connected to an alternating current (AC) line. The power supply 112 rectifies AC input and switches the AC input to drive an RF amplifier 116. The RF amplifier 116 operates at a reference frequency (13.56 MHz, for example) provided by a reference frequency generator 104. The RF amplifier 116 drives current through a power measurement circuit 118 that provides feedback signals to a comparator 120 and to the reference frequency generator 104. In this embodiment, power is measured only once, and the information is used to control the RF amplifier 116 gain, as well as a tuning system if needed. Power is then delivered to an output match section 122, which directly drives the plasma excitation circuit 106. In one embodiment, the plasma excitation circuit 106 uses helical ribbon electrodes 170 in the chamber. However, other equivalent circuits can be used, including an external electrode of capacitance coupling or inductance coupling type, for example. Positioned above the helical ribbon electrodes 170 is a heat exchanger 182 that removes heat from the helical ribbon electrodes 170 during operation. In one embodiment, the heat exchanger is a pipe that circulates fluid to remove heat. The fluid moves through the pipe and the helical ribbon electrodes 170. Fluid then enters the heat exchanger 182 and traverses through a loop. Thermal energy in the form of heat transfers to fluid in another loop, which is cooler in temperature and draws heat away from the heat in the fluid in the first loop. In a specific embodiment, cooling fluid enters and leaves the heat exchanger 182.

A controller 130 generates a periodic pulse and drives one input of the frequency reference 104. The pulse effectively turns on or off the plasma generation. One embodiment of the controller 130 generates a pulse with a frequency of ten hertz (10 Hz) or less. In another embodiment, the pulse generated has a pulse-width of approximately two hundred fifty (250) millisecond and the pulse is repeated approximately every fifty (50) microseconds.

Figure 1B:
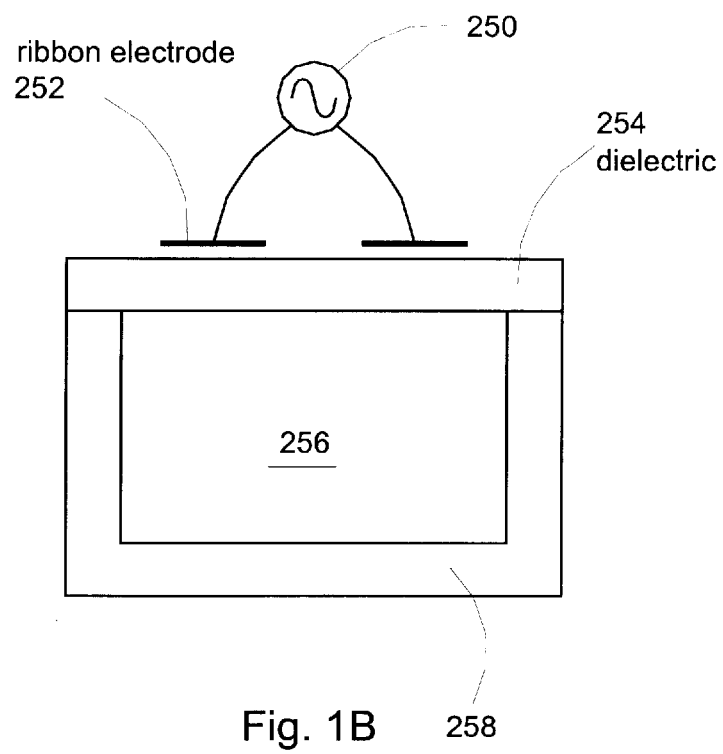

Turning now to FIG. 1B, a second embodiment is shown. FIG. 1B includes a helical ribbon electrode 252 connected to a generator 250. The helical ribbon electrode 252 rests above a dielectric wall 254. The dielectric wall 254 rests above a chamber 256 and is supported by chamber walls 258. The dielectric wall 254 allows the energy generated from the generator 250 to pass through to generate a plasma inside the chamber 256. The dielectric materials can be any non-metallic materials such as ceramics, glass, quartz, or plastic.

Figure 1C:
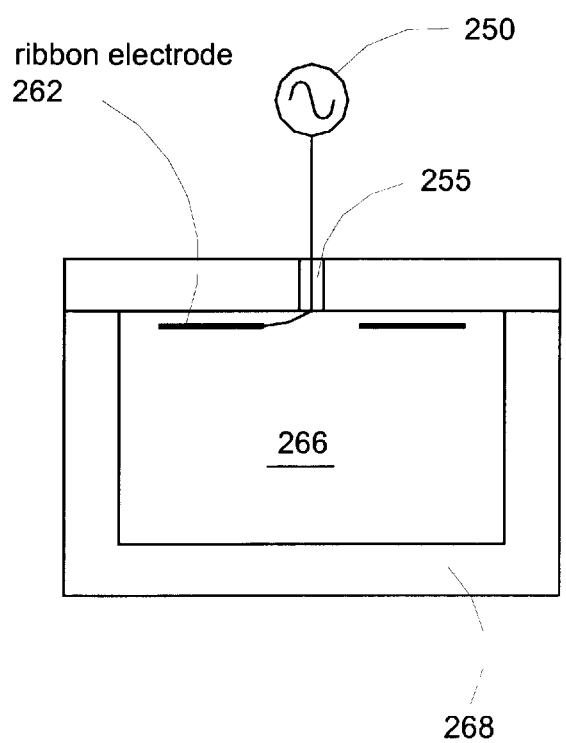

FIG. 1C shows a third embodiment where the helical ribbon electrode 262 is positioned inside a chamber 266 with walls 268. The walls 268 has a electrical feed through 255 through which the generator 250 can drive the helical ribbon electrode 262.

Figure 1D:
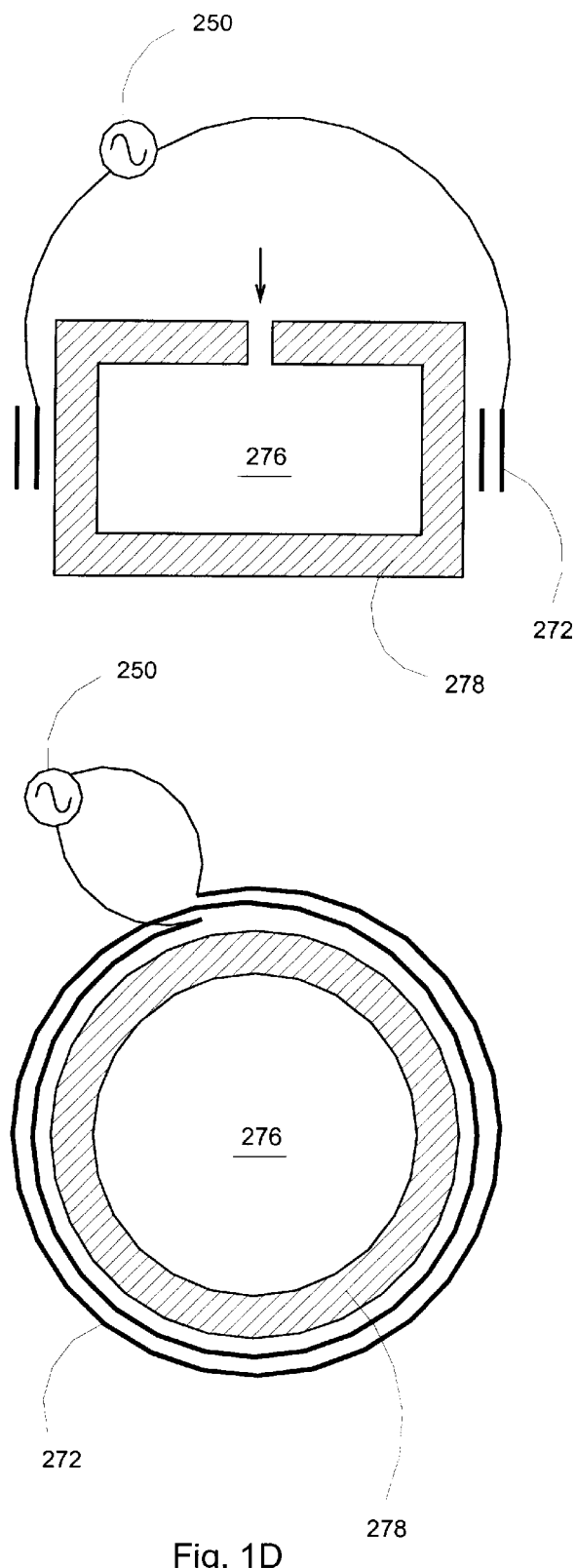

FIG. 1D shows a fourth embodiment where the helical ribbon electrode 272 wraps around a tubular dielectric wall 278. A chamber 276 is positioned within the helical ribbon electrode 272 and the tubular dielectric wall 278.

Figure 1E:
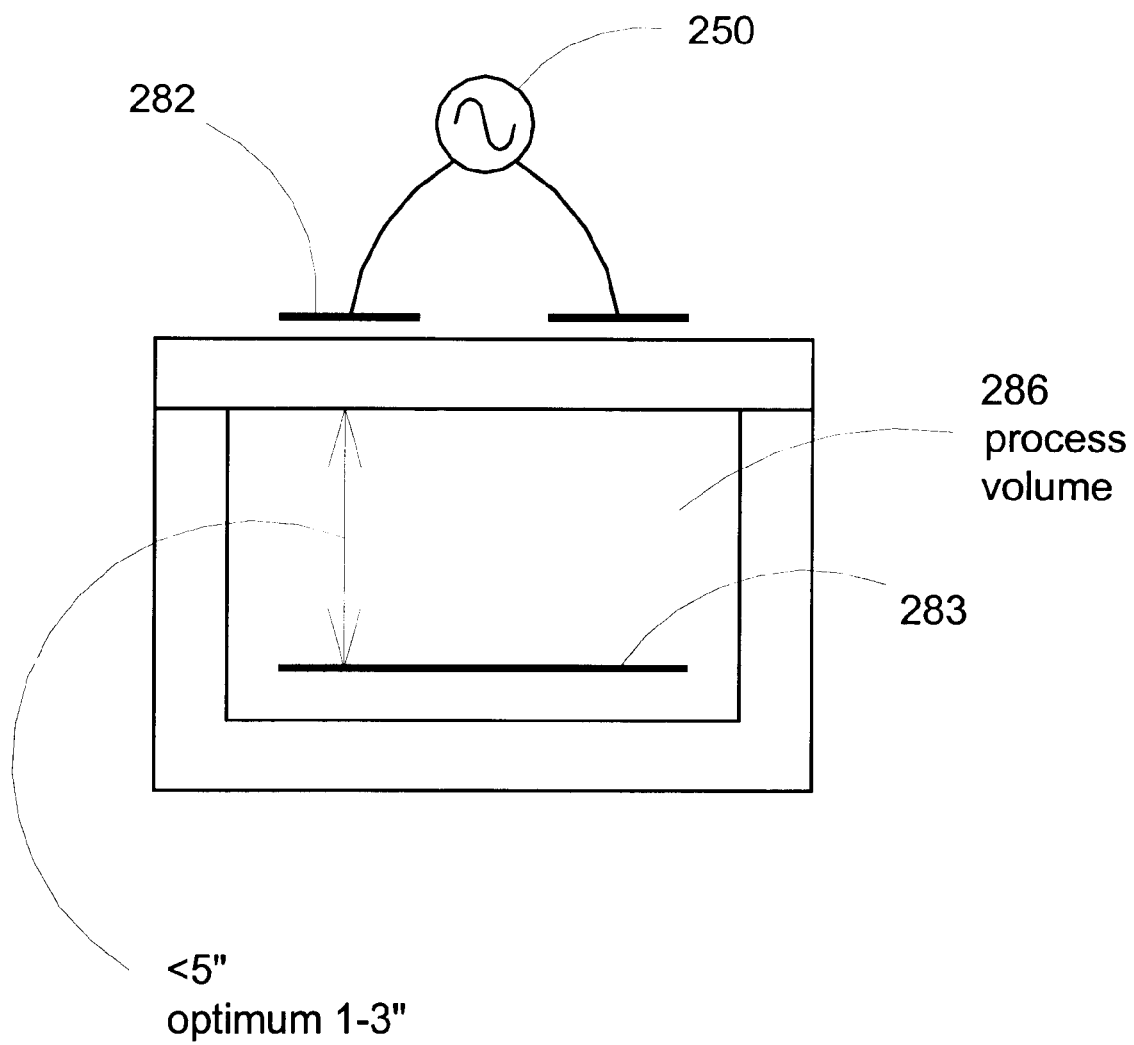

FIG. 1E shows a fifth embodiment optimized for pulsed processing. This embodiment defines an elongated chamber 286 with a small volume above a wafer 283. The volume is dependent on the diameter of the wafer 283 and the distance between a helical ribbon electrode 282 and the wafer. Typically, the distance is less than five (5) inches, but can also be between one and three inches. The helical ribbon electrode 252 in turn is driven by the generator 250. The large ratio of the width to the thickness of the ribbon electrode allows the short distance (less than 5 inches, and typically between 1 and 3 inches) and still offers the plasma uniformity required on the wafer surface.

The characteristics of a film deposited by the above techniques are dependent upon the electron temperature in the plasma, the energy of ion incident on a substrate, and the ion and radical produced in the vicinity of an ion sheath. The electron temperature distribution in the plasma, the kind of each of the ion and radical produced in the plasma, and the ratio between the amount of the ion and the amount of the radical, can be controlled by modulating a high-frequency voltage in the same manner as having been explained with respect to the plasma etching. Accordingly, when conditions for depositing a film having excellent characteristics are known, the discharge plasma is controlled by a modulated signal according to the present invention so that the above conditions are satisfied. Thus, the processing characteristics with respect to the film deposition can be improved.

Figure 2B:
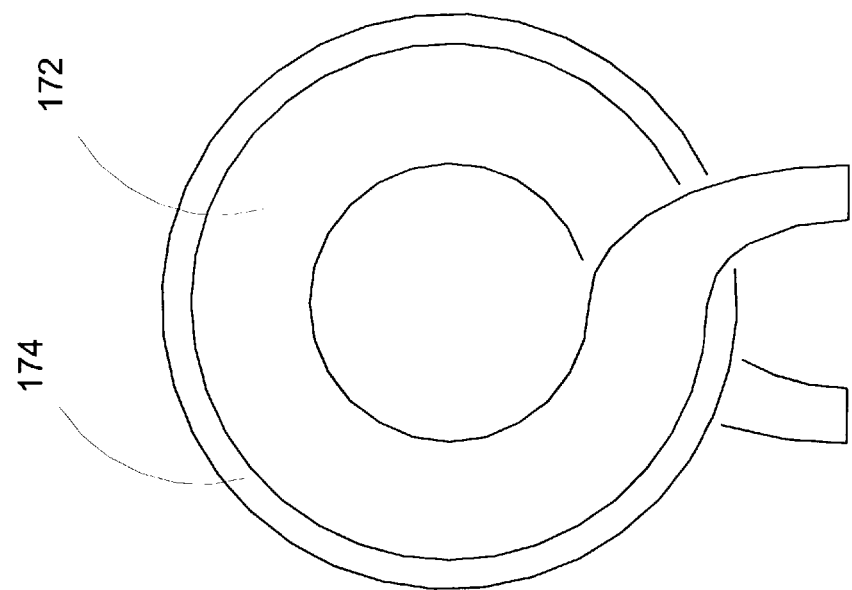
FIGS. 2A–2C show more details of the helical ribbon of FIG. 1.
Figure 2A:
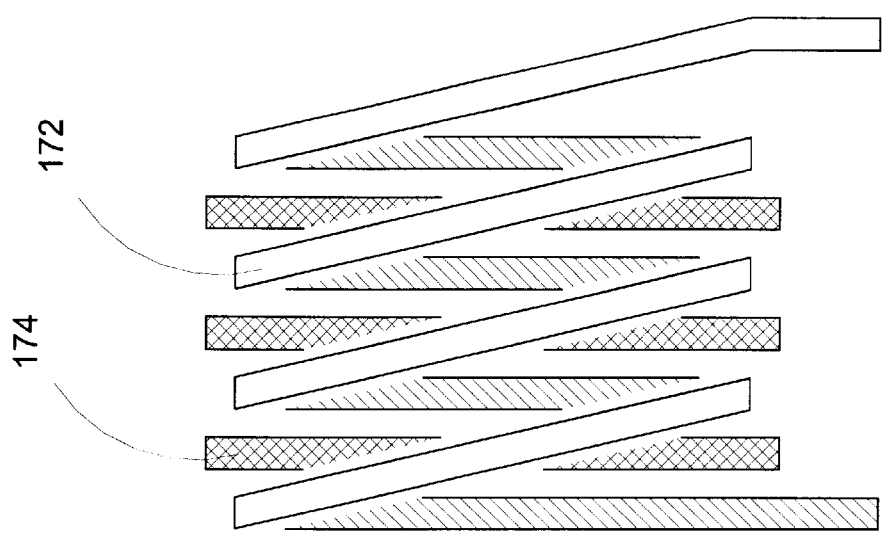
Figure 2C:
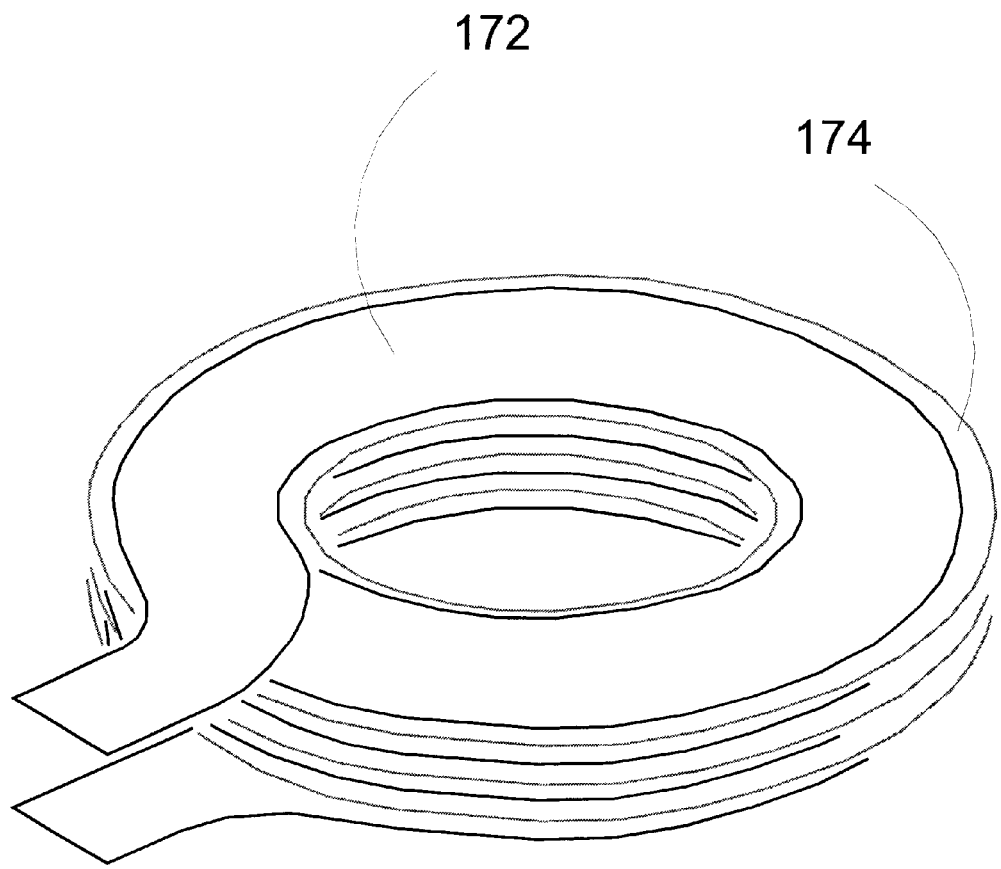

FIGS. 2A–2C show more details of the helical ribbon 170. In FIG. 2A, an elongate conductive coil 172 insulated by a sheet of dielectric material 174 is wound to form a cylindrical helix. The two sides of the helix are then compressed into planes such that the coil 172 surfaces in each side lie flat and engage the adjacent side of the sheet of dielectric material 174.

The ribbon coil 172 may have about three to ten turns and may be made of any conductive, ductile metal, such as copper or aluminum. The coil 172 has a width that is substantially greater than its thickness. Preferably, the width is approximately one hundred times the thickness, although the ratio of width w to thickness t may conceivably range from 1 to 10000, depending on mechanical considerations and/or electrical parameters. Mechanical considerations affecting the optimum width/thickness ratio include, for example, build height and turns ratio. In one embodiment, the coil 172 has three turns, with the width of the coil 172 at about 40 millimeters and a thickness at about one millimeter.

Electrical parameters affecting the optimum width/thickness ratio include electrical resistance, skin effect, and proximity effect, for example. During manufacturing, the conductive coil 172 and dielectric sheet 174 are wound in one continuous direction on a cylindrical mandrel and then compressed into a plane. With the exception of the outermost coil layers, the compressed coil engages on one side a sheet 174A of dielectric material, and on the other side a sheet 174B of dielectric material. Bends (not illustrated) are formed in the ribbon coil 172 near the ends so that the ends project radially from conductive coil 172 for external connection.

The conductive coil 172 is then compressed into a plane such that the coils lie flat and engage one side of the dielectric material sheet 174. The compressed sides form flat, concentric spirals. The width conductive coil 172 is smaller than the width of the dielectric material sheet 172 such that, when compressed, the interior or exterior of adjacent coil surfaces does not touch. The ends of the ribbon coil 172 project from the outer coil surfaces, where attachment to other electrical components can readily be accomplished.

The coil 172 may be adhered to sheet 174 of dielectric material by at least two methods. One method is to provide a sheet of dielectric material that is coated on both sides with thermal set adhesive (not illustrated). After compression, a winder is heated sufficiently to activate the thermal set adhesive to adhere the coil 172 to the dielectric material sheet 174. Alternatively, the coil 172 may be adhered to sheet 174 by insulating adhesive tape (not illustrated) disposed between each coil layer. In one embodiment, the helical ribbon 170 is available from LITMAS Corporation of Matthews, N.C.

The helical ribbon 170 enhances the uniformity of power density due to its width/thickness ratio. Power transmittance is higher because the ribbon 170 is closer to chamber. Hence, power loss is reduced. The ribbon 170 is low in profile, and supports a high density, low profile semiconductor processing system.

Figure 3:
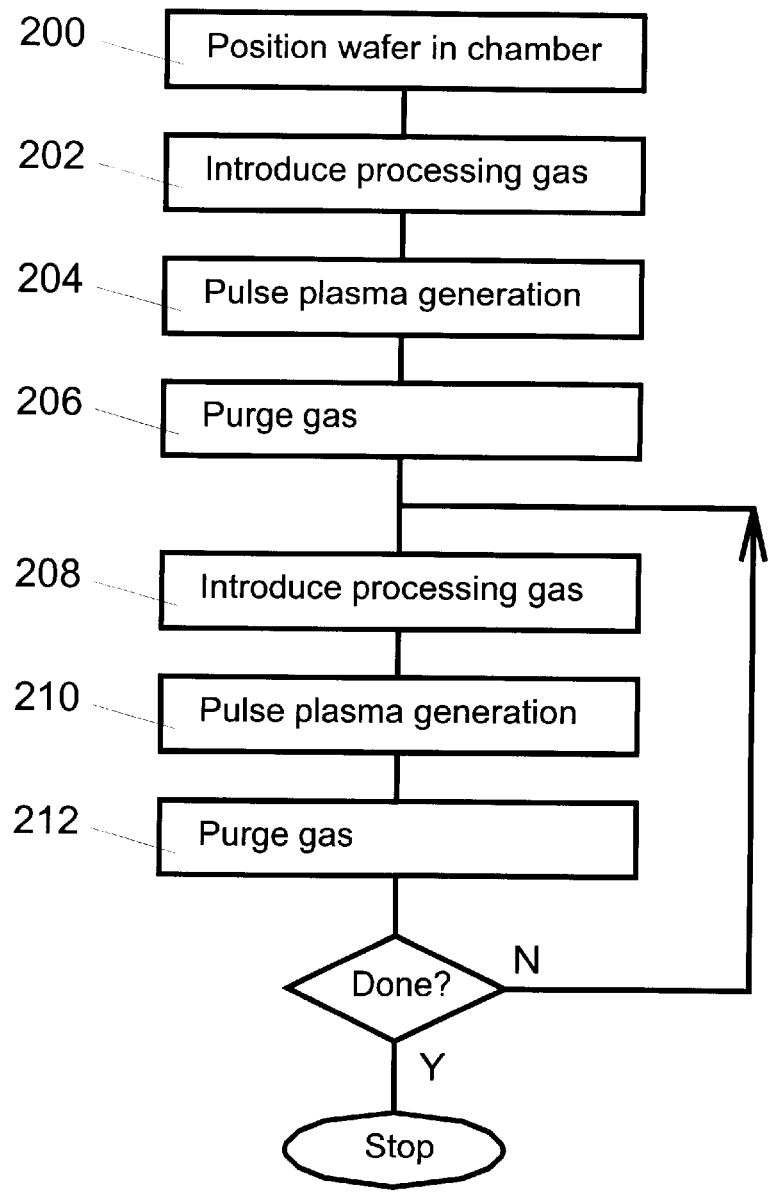
FIG. 3 shows a flowchart of one exemplary semiconductor manufacturing process using the system of FIG. 1.

FIG. 3 shows a flowchart of one exemplary semiconductor manufacturing process using the system 100 of FIG. 1. First, a wafer is positioned inside the chamber (step 200). Next, suitable processing gas is introduced into the chamber (step 202). The chamber is pressurized to a high pressure level such as four hundred millitorr (400 mT). The pressure level can range between about one hundred millitorr (100 mT) to about ten torr (10 T) (step 203). The controller 130 is periodically turned on in accordance with a process activation switch to drive the desired process (step 204). The particular type of process to be performed affects the process activation switch choice. The choice of activation switch for any device fabrication process, regardless of whether the process is a deposition or etch process, also may significantly affect the final semiconductor device properties. At the conclusion of the processing of one layer of material, the gas in the chamber is purged (step 206), and the chamber is ready to accept further processing. Thus, for the next layer of material, suitable processing gas is introduced into the chamber (step 208). The chamber is pressurized to a high pressure level above approximately one hundred millitorr (100 mT) (step 209), and the controller 130 is periodically turned on to drive the desired process (step 210). At the conclusion of the processing of the second layer of material, the gas in the chamber is purged (step 212), and the chamber is ready to accept yet another layer of material. This process is repeated for each layer in the multi-layer wafer.

In another embodiment, thin film is deposited using chemical vapor deposition by evacuating a chamber of gases; exposing a part to a gaseous first reactant, wherein the first reactant deposits on the part to form the thin film; evacuating the chamber of gases; exposing the part, coated with the first reactant, to a gaseous second reactant of plasma at a high pressure, wherein the plasma converts the second reactant on the part to one or more elements, wherein the thin film deposited is treated; and evacuating the chamber of gases.

Figure 4A:
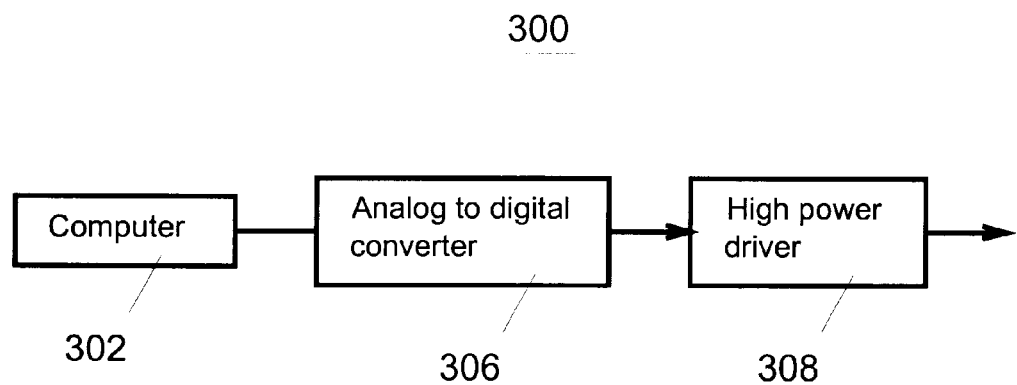
FIGS. 4A–4B show exemplary generator embodiments.

FIG. 4A shows one exemplary controller 300. The controller 300 includes a computer 302 driving a digital to analog converter (DAC) 306. The DAC 306 generates shaped waveforms and is connected to a high-voltage isolation unit 308 such as a power transistor or a relay to drive the plasma generator 110. The controller 300 can generate various waveforms such as a rectangular wave and a sinusoidal wave, and moreover can change the period and amplitude of such waveforms. Further, in the above explanation, the RF power supplied to a plasma is modulated with a rectangular wave. However, the modulation waveform is not limited to the rectangular wave. In other words, when a desired ion energy distribution, a desired electron temperature distribution, and a desired ratio between the amount of the desired ion and the amount of the desired radical, are known, the modulation waveform is determined in accordance with these factors. The use of a rectangular wave as the modulation waveform has an advantage that a processing condition can be readily set and the plasma processing can be readily controlled. It is to be noted that since the rectangular wave modulates the signal from the RF source in a discrete fashion, the rectangular wave can readily set the processing condition, as compared with the sinusoidal wave and the compound wave of it. Further, the pulse generator can also generate amplitude modulated signals in addition or in combination with the frequency modulated signals.

Figure 4B:
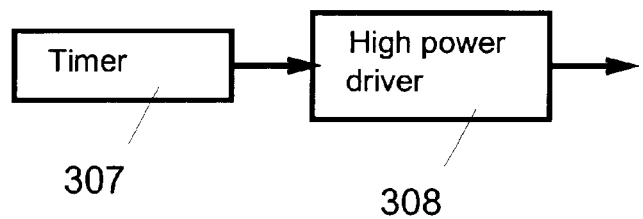

FIG. 4B shows an exemplary embodiment that uses a timer chip such as a 555 timer, available from Signetics of Sunnyvale, Calif. The timer chip 555 is preconfigured through suitable resistive-capacitive (RC) network to generate pulses at specified intervals. The timer chip 555 generates shaped waveforms and is connected to a high-voltage isolation unit 308 such as a power transistor or a relay to drive the plasma generator 110, as discussed above.

Figure 5:
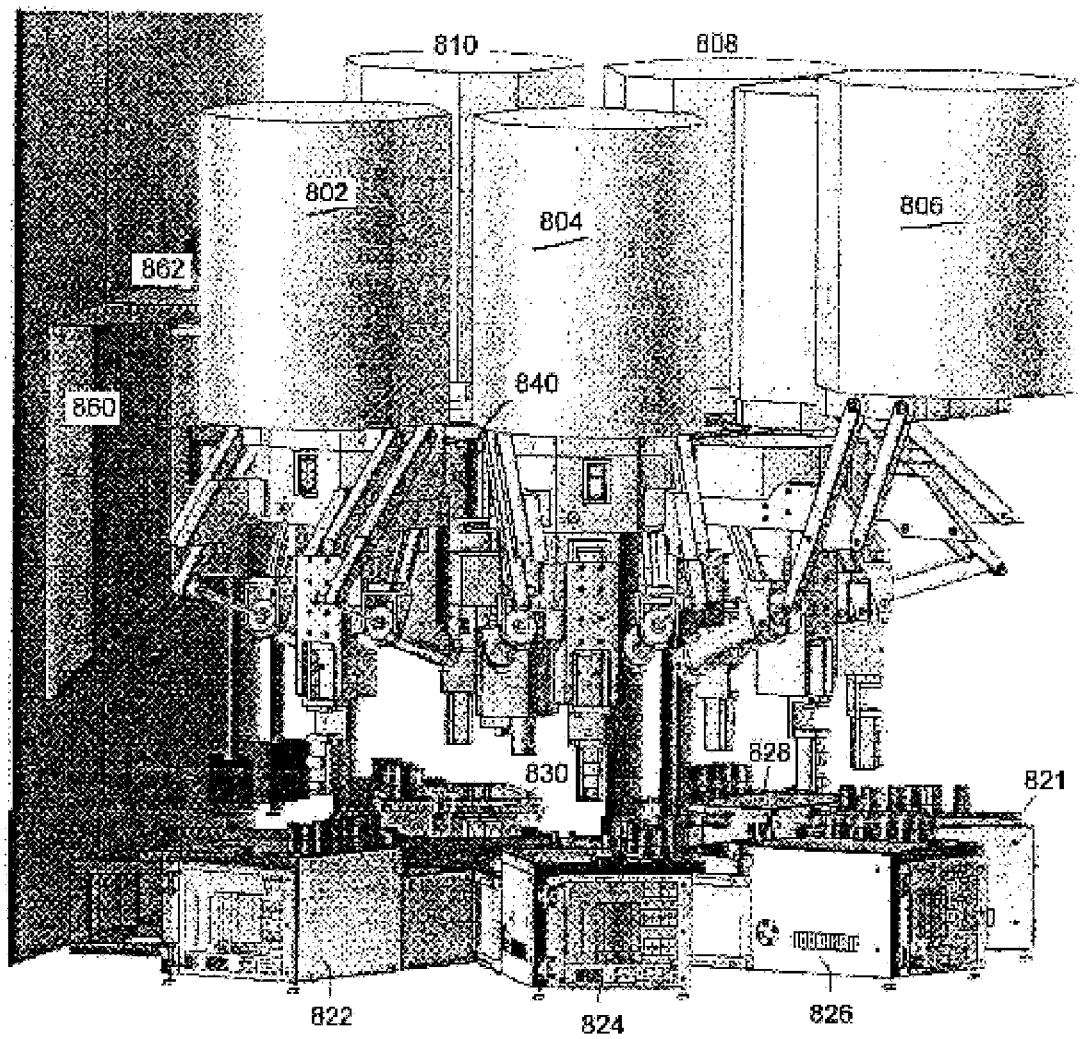
FIG. 5 shows a multi-chamber semiconductor processing system.

Referring now to FIG. 5, a multi-chamber semiconductor processing system 800 is shown. The processing system 800 has a plurality of chambers 802, 804, 806, 808 and 810 adapted to receive and process wafers 842. Controllers 822, 824, 826, 828 and 830 control each of the chambers 802, 804, 808 and 810, respectively. Additionally, a controller 821 controls another chamber, which is not shown for illustrative purposes.

Each of chambers 802–810 provides a lid 104 on the chamber body 102. During maintenance operations, the lid 104 can be actuated into the open position so that components inside the chamber body 102 can be readily accessed for cleaning or replacement as needed.

The chambers 802–810 are connected to a transfer chamber 840 that receives a wafer 842. The wafer 842 rests on top of a robot blade or arm 846. The robot blade 846 receives wafer 842 from an outside processing area.

The transport of wafers 842 between processing areas entails passing the wafers through one or more doors separating the areas. The doors can be load lock chambers 860–862 for passing a wafer-containing container or wafer boat that can hold about twenty-five wafers in one embodiment. The wafers 842 are transported in the container through the chamber from one area to another area. The load lock can also provide an air circulation and filtration system that effectively flushes the ambient air surrounding the wafers.

Each load lock chamber 860 or 862 is positioned between sealed opening 850 or 852, and provides the ability to transfer semiconductor wafers between fabrication areas. The load locks 860–862 can include an air circulation and filtration system that effectively flushes the ambient air surrounding the wafers. The air within each load lock chamber 860 or 862 can also be purged during wafer transfer operations, significantly reducing the number of airborne contaminants transferred from one fabrication area into the other. The load lock chambers 860–862 can also include pressure sensors 870–872 that take air pressure measurements for control purposes.

During operation, a wafer cassette on a wafer boat is loaded at openings 850–852 in front of the system to a load lock through the load lock doors. The doors are closed, and the system is evacuated to a pressure as measured by the pressure sensors 870–872. A slit valve (not shown) is opened to allow the wafer to be transported from the load lock into the transfer chamber. The robot blade takes the wafer and delivers the wafer to an appropriate chamber. A second slit valve opens between the transfer chamber and process chamber, and wafer is brought inside the process chamber.

Containers thus remain within their respective fabrication areas during wafer transfer operations, and any contaminants clinging to containers are not transferred with the wafers from one fabrication area into the other. In addition, the air within the transfer chamber can be purged during wafer transfer operations, significantly reducing the number of airborne contaminants transferred from one fabrication area into the other. Thus during operation, the transfer chamber provides a high level of isolation between fabrication stations.

Figure 6:
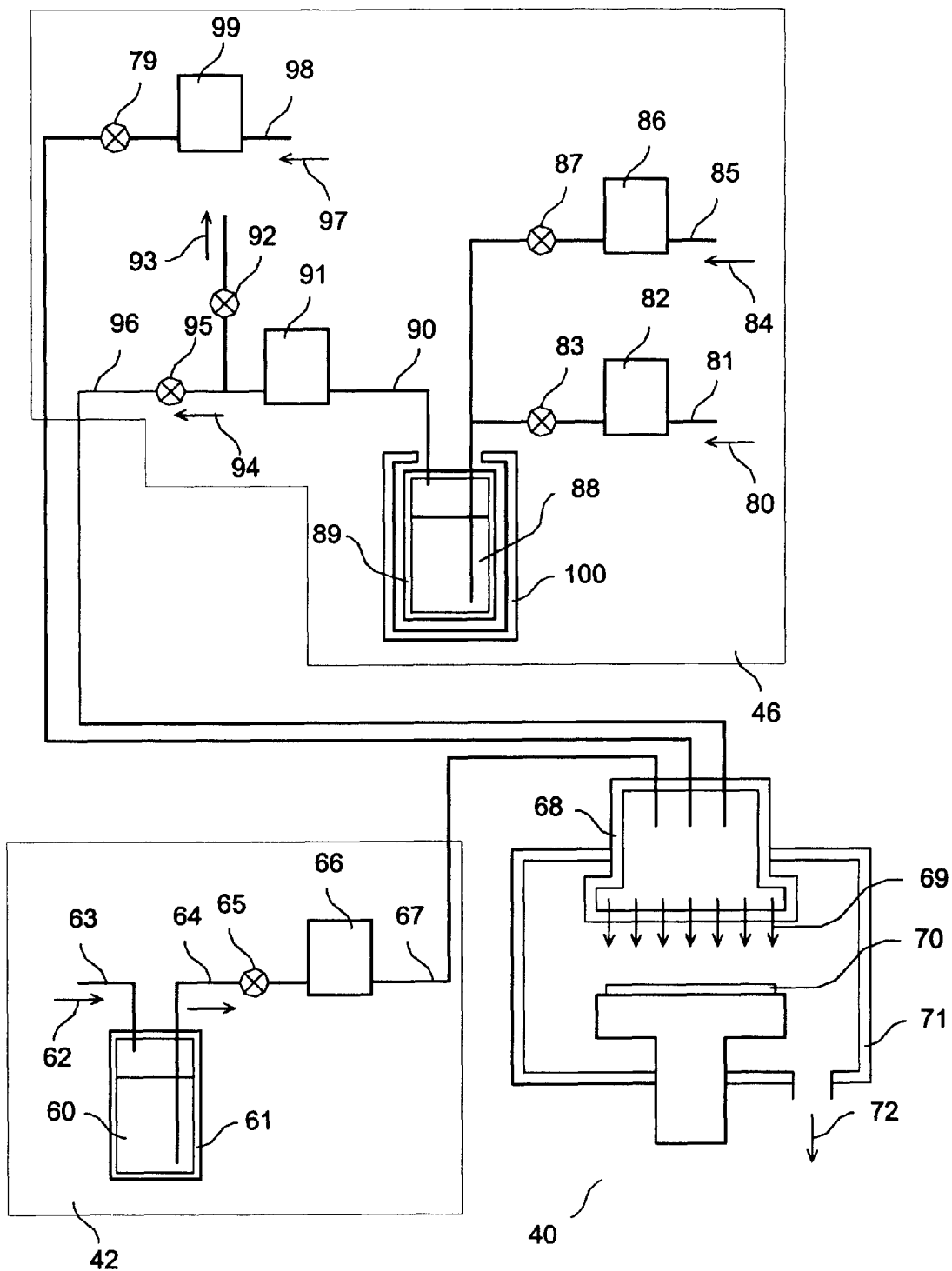
FIG. 6 shows an exemplary an apparatus for liquid and vapor precursor delivery.

FIG. 6 shows an exemplary apparatus 40 for liquid and vapor precursor delivery using either the system 100 or the system 300. The apparatus 40 includes a chamber 44 such as a CVD or NLD chamber. The chamber 40 includes a chamber body 71 that defines an evacuable enclosure for carrying out substrate processing. The chamber body has a plurality of ports including at least a substrate entry port that is selectively sealed by a slit valve and a side port through which a substrate support member can move. The apparatus 40 also includes a vapor precursor injector 46 connected to the chamber 44 and a liquid precursor injector 42 connected to the chamber 44.

In the liquid precursor injector 42, a precursor 60 is placed in a sealed container 61. An inert gas 62, such as argon, is injected into the container 61 through a tube 63 to increase the pressure in the container 61 to cause the copper precursor 60 to flow through a tube 64 when a valve 65 is opened. The liquid precursor 60 is metered by a liquid mass flow controller 66 and flows into a tube 67 and into a vaporizer 68, which is attached to the CVD or NLD chamber 71. The vaporizer 68 heats the liquid causing the precursor 60 to vaporize into a gas 69 and flow over a substrate 70, which is heated to an appropriate temperature by a susceptor to cause the copper precursor 60 to decompose and deposit a copper layer on the substrate 70. The CVD chamber 71 is sealed from the atmosphere with exhaust pumping 72 and allows the deposition to occur in a controlled partial vacuum.

In the vapor precursor injector 46, a liquid precursor 88 is contained in a sealed container 89 which is surrounded by a temperature controlled jacket 91 and allows the precursor temperature to be controlled to within 0.1° C. A thermocouple (not shown) is immersed in the precursor 88 and an electronic control circuit (not shown) controls the temperature of the jacket 91, which controls the temperature of the liquid precursor and thereby controls the precursor vapor pressure. The liquid precursor can be either heated or cooled to provide the proper vapor pressure required for a particular deposition process. A carrier gas 80 is allowed to flow through a gas mass flow controller 82 when valve 83 and either valve 92 or valve 95 but not both are opened. Also shown is one or more additional gas mass flow controllers 86 to allow additional gases 84 to also flow when valve 87 is opened, if desired. Additional gases 97 can also be injected into the vaporizer 68 through an inlet tube attached to valve 79, which is attached to a gas mass flow controller 99. Depending on its vapor pressure, a certain amount of precursor 88 will be carried by the carrier gases 80 and 84, and exhausted through tube 93 when valve 92 is open.

After the substrate has been placed into the CVD or NLD chamber 71, it is heated by a heater 100 or 300, as discussed above. After the substrate has reached an appropriate temperature, valve 92 is closed and valve 95 is opened allowing the carrier gases 80 and 84 and the precursor vapor to enter the vaporizer 68 through the attached tube 96 attached tube 96. Such a valve arrangement prevents a burst of vapor into the chamber 71. A vapor distribution system, such as a shower head 68 or a distribution ring (not shown), is used to evenly distribute the precursor vapor over the substrate 70. After a predetermined time, depending on the deposition rate and the thickness required for the initial film deposition, valve 95 is closed and valve 92 is opened. The flow rate of the carrier gas can be accurately controlled to as little as 1 sccm per minute and the vapor pressure of the precursor can be reduced to a fraction of an atmosphere by cooling the precursor 88. Such an arrangement allows for accurately controlling the deposition rate to less than 10 angstroms per minute if so desired.

Figure 7A:
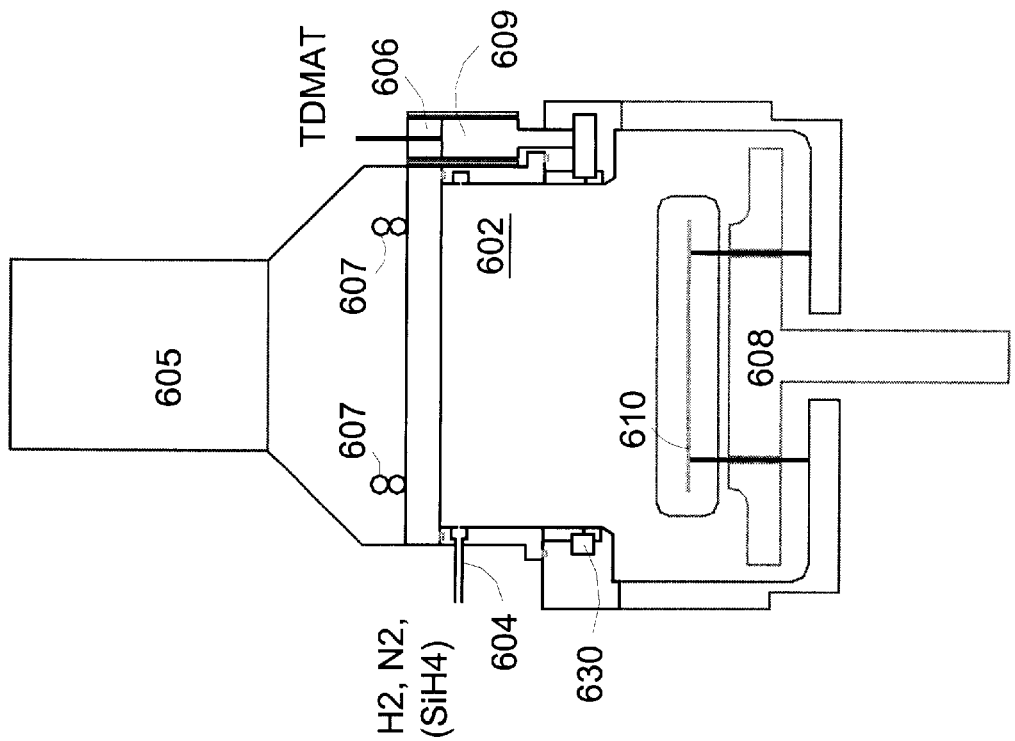
FIGS. 7A–7B show two operating conditions of an embodiment to perform plasma deposition.
Figure 7B:
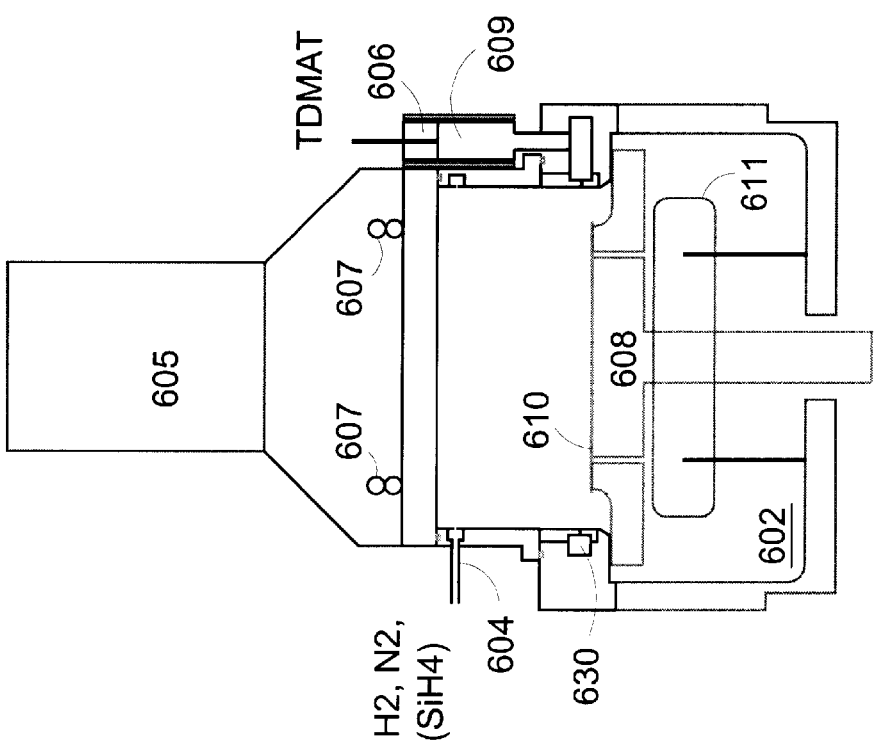

FIGS. 7A–7B show two operating conditions of an embodiment 600 to perform high pressure barrier pulsed plasma atomic layer deposition. FIG. 7A shows the embodiment 600 in a deposition condition, while FIG. 7B shows the embodiment 600 in a rest condition. Referring now to FIGS. 7A–7B, a chamber 602 receives gases through one or more gas inlets 604. A solid state plasma generator 605 is mounted on top of the chamber 602 and one or more plasma excitation coils 607 are positioned near the gas inlets 604. A liquid precursor system 606 introduces precursor gases through a vaporizer 609 into the chamber 602 using a precursor distribution ring 630.

A chuck 608 movably supports a substrate 610. In FIG. 6A, the chuck 608 and the substrate 610 are elevated and ready for deposition. The substrate 610 is positioned inside the chamber. Suitable processing gas is introduced into the chamber through the inlets 604, and a pulsed plasma controller 605 is periodically turned on in accordance with a process activation switch to drive the desired process. The particular type of process to be performed affects the process activation switch choice. The choice of activation switch for any device fabrication process, regardless of whether the process is a deposition or etch process, also may significantly affect the final semiconductor device properties. At the conclusion of the processing of one layer of material, the gas in the chamber 602 is purged, and the chamber 602 is ready to accept further processing. This process is repeated for each layer in the multi-layer wafer. At the conclusion of deposition of all layers, the chuck 608 is lowered and the substrate 610 can be removed through an opening 611.

The system allows the substrates to have temperature uniformity through reliable real-time, multi-point temperature measurements in a closed-loop temperature control. The control portion is implemented in a computer program executed on a programmable computer having a processor, a data storage system, volatile and non-volatile memory and/or storage elements, at least one input device and at least one output device.

Each computer program is tangibly stored in a machine-readable storage medium or device (e.g., program memory 522 or magnetic disk) readable by a general or special purpose programmable computer, for configuring and controlling operation of a computer when the storage media or device is read by the computer to perform the processes described herein. The invention may also be considered to be embodied in a computer-readable storage medium, configured with a computer program, where the storage medium so configured causes a computer to operate in a specific and predefined manner to perform the functions described herein.

The results of one experimental run are discussed next. First, an exemplary process recipe for depositing titanium nitride is detailed below:

| Process | step | time | function | Pressure(T) | carrier | liquid | $N_2$ | plasma | $H_2$ | chuck |
|---|---|---|---|---|---|---|---|---|---|---|
| Pre-clean | 1 | 4 s | Pump | 0 | 0 | 0 | 0 | 0 | 0 | up |
| | 2 | 3 s | Strike | 0 | 0 | 0 | 5 | 1200 | 0 | up |
| | 3 | 15 s | Plasma | 0.4 | 100 | 0 | 5 | 1200 | 0 | up |
| deposition | 4 | 10 s | Stab | 1.5 | 100 | −10 | 0 | 0 | 0 | up |
| | 5 | 6 s | dep1 | 1.5 | 100 | 10 | 0 | 0 | 0 | up |
| | 6 | 3 s | Purge | 0 | 100 | 0 | 0 | 0 | 0 | up |
| | 7 | 3 s | Pump | 0 | 0 | 0 | 0 | 0 | 0 | up |
| | 8 | 3 s | Strike | 0 | 0 | 0 | 5 | 1200 | 0 | up |
| | 9 | 30 s | plasma1 | 0.4 | 100 | 0 | 5 | 1200 | 0 | up |
| | 10 | loop to step 4(stab) | | | | | | | | |
| Cooling | 11 | 1 s | Plasma off | 0 | 100 | 0 | 0 | 0 | 0 | up |
| | 12 | 30 s | Cool | 0 | 100 | 0 | 0 | 0 | 0 | down |

Steps 1–3 relate to pre-cleaning of the substrate surface. In these steps, the chamber is brought to a low pressure by turning on a pump for 4 seconds. Next, the plasma is struck for 3 seconds. The strike operation allows the plasma to be started at low pressure and then the plasma is turned on for 15 seconds at high pressure. The plasma is turned on at a pressure of 0.4 Torr to provide high pressure, high density plasma for isotropic surface conditioning.

After pre-cleaning, the flow and pressure is stabilized for 10 seconds. A first deposition step is performed for 6 seconds. The chamber is purged with carrier gas or an inert gas such as $N_2$ for 3 seconds, and the valve to the pump is open on for 3 seconds to remove all liquid precursors and/or vapor residues in the chamber. A plasma strike operation is performed for 3 seconds, and plasma treatment for the first deposition is activated for 30 seconds at high pressure of 0.4 Torr. For each additional deposition, the process loops back to step 4. When the wafer deposition is complete, the plasma is turned off for one second and the substrate is optionally cooled down for 30 seconds before it is removed from the chamber. The timing of the steps are illustrative and can be varied from as low as a half a second to as high as five minutes, depending on the desired property of the film and the film quality, among others.

Figure 8:
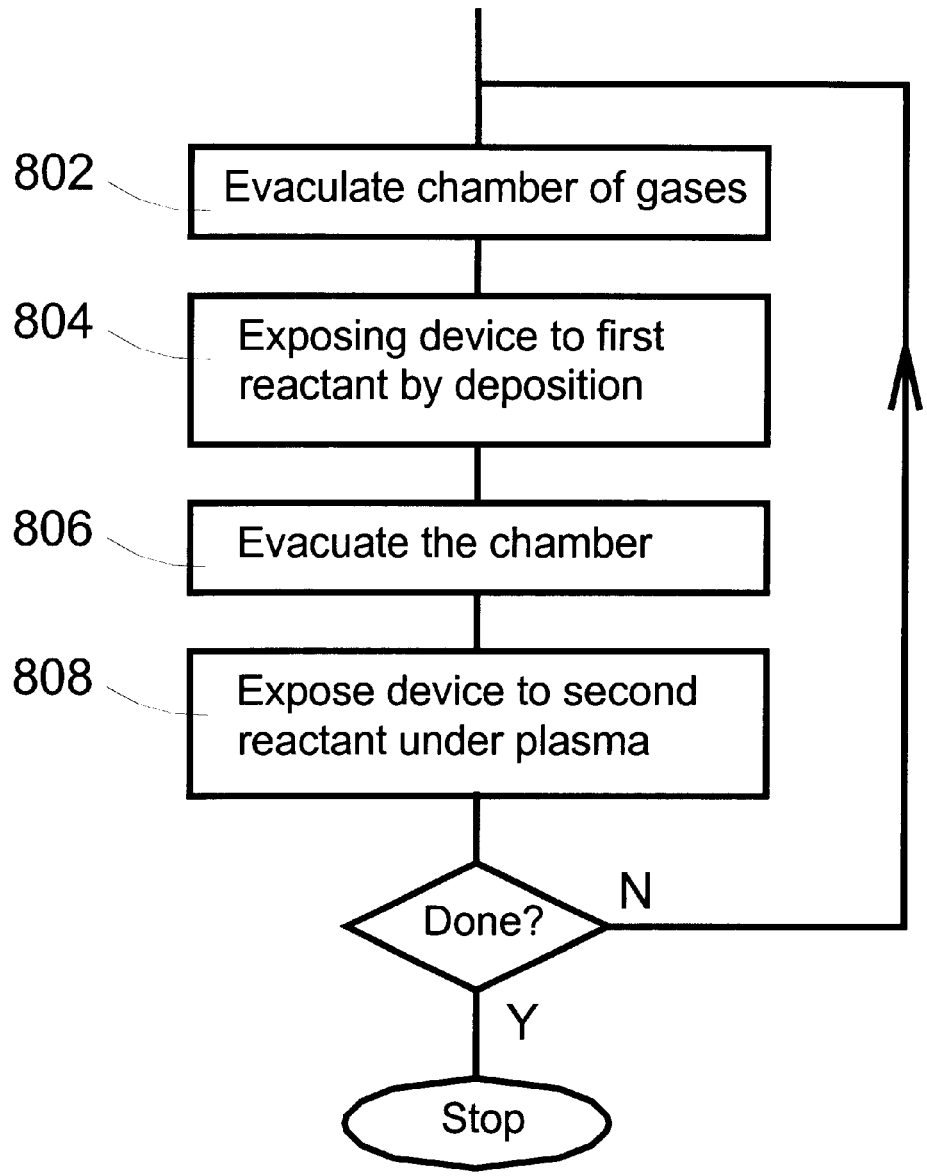
FIG. 8 shows a flow chart of a nanolayer thick film process in accordance with one embodiment of the invention.

FIG. 8 shows a flow chart of a nanolayer thick film process in accordance with one embodiment of the invention. Nanolayer deposition (NLD) technique is a combination of ALD and CVD and thus makes use of the advantages of both ALD and CVD. The process of FIG. 8 includes evacuating a chamber of gases (step 802); exposing a device to a gaseous first reactant, wherein the first reactant deposits on the device to form the thin film; purging the chamber (step 804); evacuating the chamber of gases (step 806); and exposing the device, coated with the first reactant, to a gaseous second reactant under plasma, wherein the thin film deposited by the first reactant is treated to form the same materials or a different material (step 808).

In one embodiment of the process of FIG. 8, a first gas reactant is flown over wafer surface and deposits on the wafer. The amount of the first gas reactant into the chamber is controlled by a liquid flow controller (LFC) and valves to control the deposition of a layer that is more than a monolayer thick to a few nanometer thick. The first reactant then is purged with inert gas (optional), and pumped. A second reactant is flown into chamber to react with the first reactant to form a layer that is more than a monolayer thick to a few nanometer thick. A high density plasma may be used during the second reactant injection to enhance or maintain the conformality of the deposited film on complex topography. The density of the deposited film may also increased after the high density plasma treatment during the second reactant injection. The second reactant then is optionally purged and removed by pumping. Other reactants can be flown in to react with deposited and reacted film to form a final film. The above steps are repeated to form a thick film that is a multiple in thickness of the layer that is more than a monolayer thick to a few nanometer thick. The thickness of each repeat or cycle deposited thus is more than a monolayer thick but within a thickness that the subsequent reactants under high density plasma can react with the full thickness of the deposited film to achieve a high quality and uniform film.

For the above NLD process, the materials deposit on the wafer in the deposition temperature regime and not adsorption regime. The temperature in some cases is higher than the temperature of the ALD process, but lower than that of the conventional CVD process. Since it is a deposition process rather than a self-limiting surface adsorption reaction process, the deposition rate in the NLD process to achieve a thickness of more than a monolayer to a few nanometer is controlled by an LFC and valves. The deposition rate in NLD process to achieve a film thickness of more than a monolayer to a few nanometers can also be controlled by tailoring the wafer temperature or chuck (or susceptor) temperature, process pressure, gas flow rate, among others.

The process of deposition of nanolayer thick film provides almost completely conformal deposition on complex topography as that in semiconductor devices having 0.1 micron width with an aspect ratio of more than 8:1. Excellent conformality of film is achieved with NLD similar to that of ALD, and far superior than conformality of thick CVD film. Since in each cycle of NLD process, a film of more than a monolayer to a few nanometer thick film is deposited, throughput is higher than that of ALD, when a film of a few nanometer thick to tens of nanometer thick is required. The temperature of deposition is lower than CVD and adequate for other semiconductor processes. Since a film of more than a monolayer to a few nanometer thick is deposited in each cycle, the microstructure of the resulting film can be of nanocrystalline structure in an amorphous matrix, which can be ideal for certain applications such as diffusion barrier for copper. Since NLD is a deposition process, the precursors or gases are not limited to only those having the self-limiting surface reaction. NLD thus is precursor-dependent and can be used to deposit a vast number of film materials from currently available precursors. Since NLD process has high throughput, the minimal volume constraint as in ALD process is not necessary, and conventional CVD chamber can be used to achieve highly conformal, high quality, high throughput films.

Figure 9:
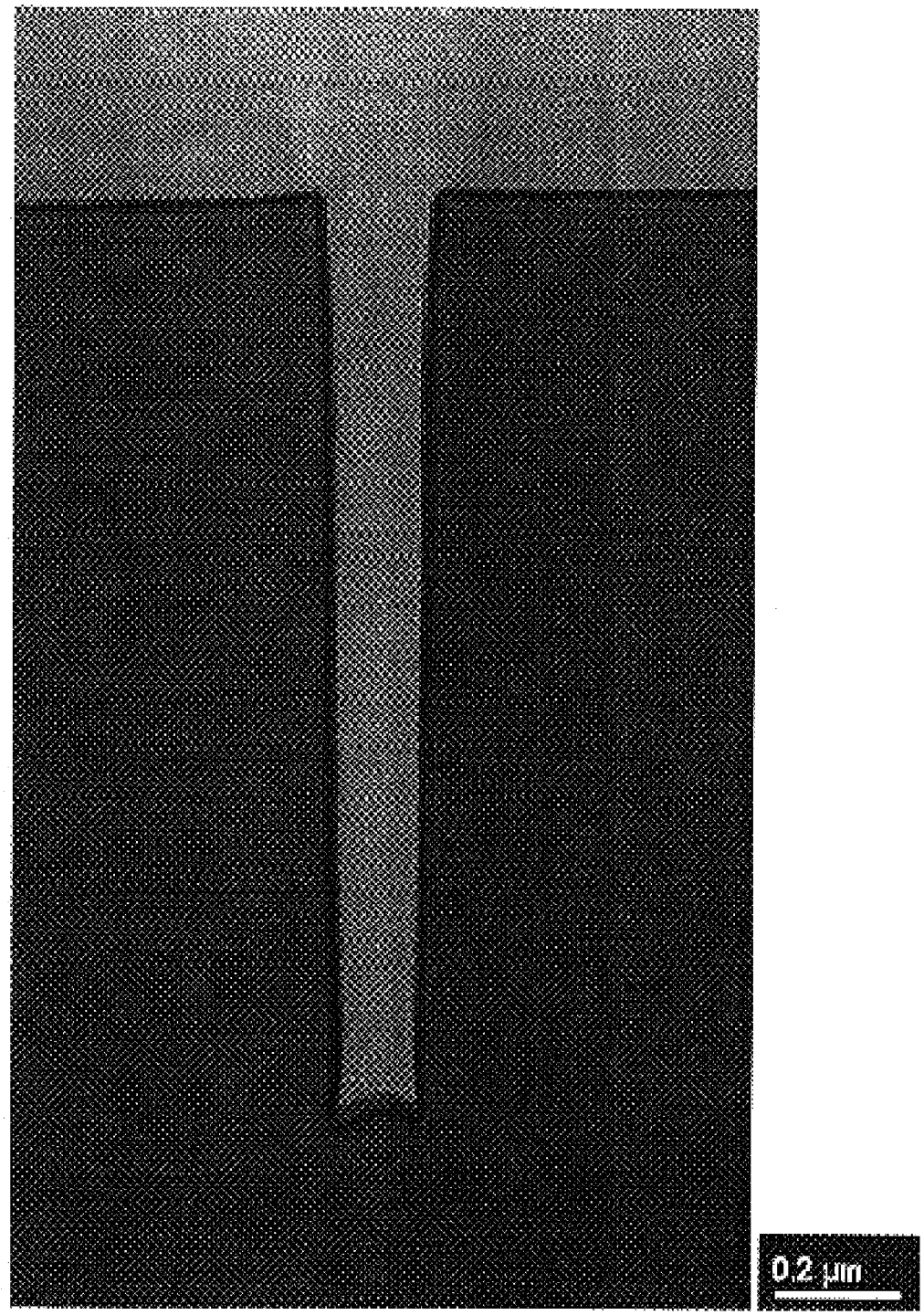
FIG. 9 shows an SEM of an exemplary wafer created in accordance with one embodiment of the invention.

FIG. 9 shows a Transmission Electron Micrograph (TEM) of a structure that is deposited with a thin film in accordance with the steps discussed above. The structure has a height of approximately 800 nm, and an average width of approximately 90 nm. The aspect ratio of the structure is thus more than 8:1. Also seen in the Figure is 9 nm thin film of TiN that is deposited film in accordance with the steps discussed above onto the structure from the top. As shown therein, the thickness of the deposited film is approximately the same on top, on the sidewalls, and on the bottom of the structure, within the measurement approximation. Close examination of the micrograph indicates that the conformality of the deposited film is close to 100%. In comparison, conventional deposition methods using low density plasma—capacitance coupled plasma typically result in a directional, non-isotropic bombardment of plasma treatment, resulting in non-treatment of the sidewalls.

Figure 10:
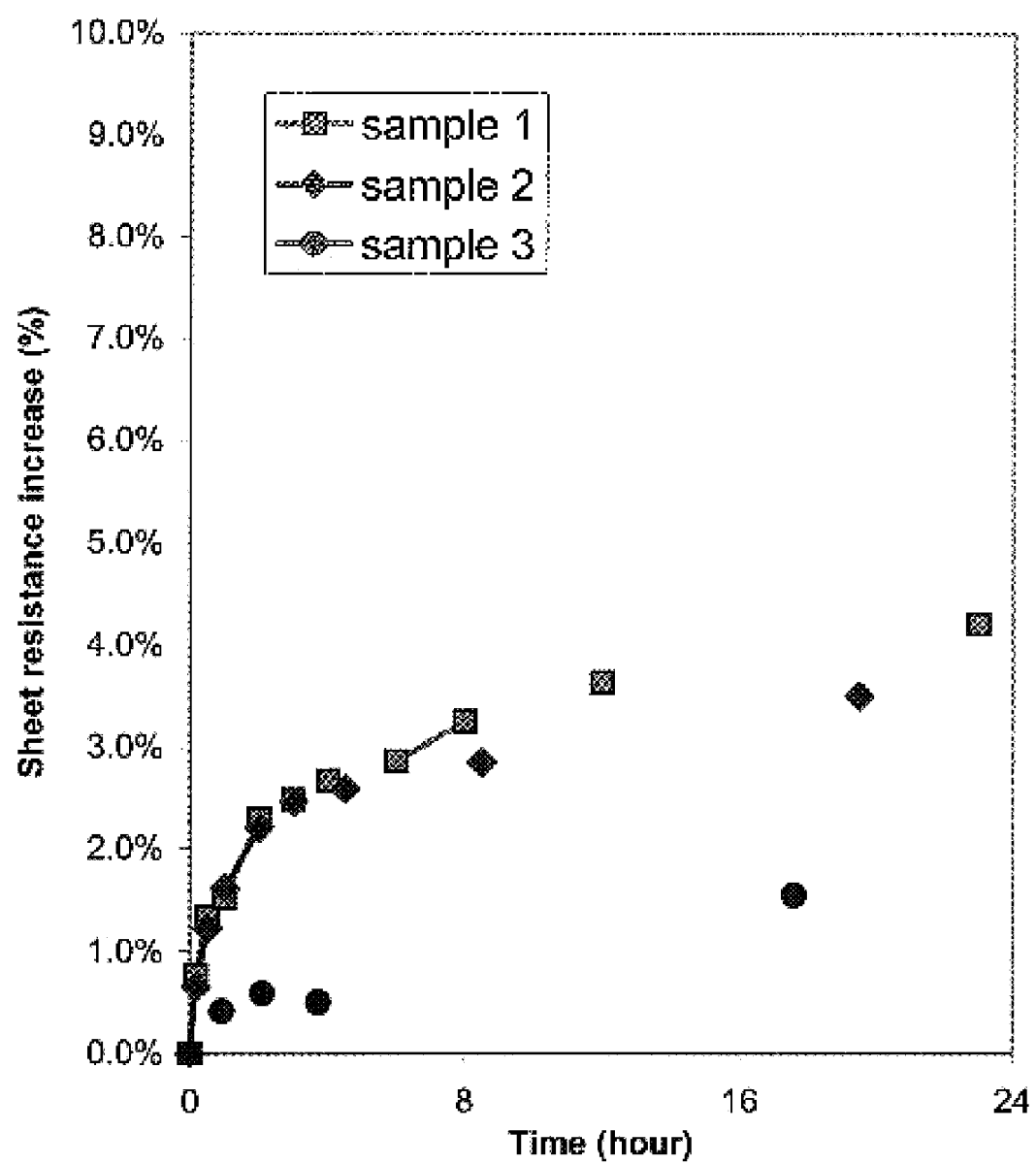
FIG. 10 shows a plot of film resistance increase as a function of time for an exemplary process recipe.

FIG. 10 shows a plot of film resistance increase of the titanium nitride (TiN) thin films as a function of time for the above process. The demonstrated TiN film was deposited using TDMAT precursor and $N_2$ flow under plasma treatment in accordance with the steps discussed above. The wafer temperature during deposition was approximately 325 degrees Celsius. The resistivity of the bulk film is approximately 300 $\mu$Ohm-cm. As shown therein, the sheet resistance increases approximately 4.2% for sample 1 which has a thickness of approximately 10 nm, approximately 3.5% for sample 2 which has a thickness of approximately 20 nm, and less than 2% for sample 3 which has a thickness of approximately 60 nm, over a period of approximately twenty four hours. The plot shows that the film is stable with minor resistance fluctuations. The increase in resistance in these TiN films deposited with a thin film in accordance with the steps discussed above is significantly lower than reported values. K.-C. Park et al. reported a 100 nm thick TiN film deposited using TDMAT precursor in an $N_2$ ion-beam-induced plasma CVD system increases almost 10% in resistivity after 24 hour air exposure. The conformality of the films also degrades to below 5%, in contrast to almost 100% conformality achieved with the film deposited in accordance with the steps discussed above. The advantage of using TDMAT precursor for TiN deposition is the lower deposition temperature compared to other precursors such as $TiCl_4$ and $NH_3$ which require a deposition temperature of higher than 600 degrees Celsius for good quality TiN film. Thermal TDMAT and TDEAT process produce highly conformal TiN films but with high carbon contamination, high resistivity of more than 2000 $\mu$Ohm-cm, and unstable after air-exposure. Reactions with these films with $NH_3$ in various plasma reduce the impurities and resistivity, the conformality however is also degraded. Nitrogen plasma treatments have also been studied with TDMAT precursor. In general however, conventional deposition methods using low density plasma—capacitance coupled plasma in down-stream or parallel plate configuration typically result in a directional, non-isotropic bombardment of plasma treatment, resulting in non-treatment of the sidewalls. More details on TiN deposition using different precursors and plasma treatments are discussed in K.-C. Park et al., the content of which is incorporated by reference.

It should be realized that the above examples represent a few of a virtually unlimited number of applications of the plasma processing techniques embodied within the scope of the present invention. Furthermore, although the invention has been described with reference to the above specific embodiments, this description is not to be construed in a limiting sense. For example, the duty ratio, cycle time and other parameter/condition may be changed in order to obtain a desired characteristic for the wafer.

Various modifications of the disclosed embodiment, as well as alternative embodiments of the invention will become apparent to persons skilled in the art upon reference to the above description. The invention, however, is not limited to the embodiment depicted and described. For instance, the radiation source can be a radio frequency heater rather than a lamp. Hence, the scope of the invention is defined by the appended claims. It is further contemplated that the appended claims will cover such modifications that fall within the true scope of the invention.

What is claimed is:

1. A process to deposit a thin film on a device by chemical vapor deposition, comprising:
   evacuating a chamber of gases;
   (a) exposing a device to a gaseous first reactant, wherein the first reactant deposits on the device to form a layer having a thickness of more than a monolayer;
   (b) evacuating the chamber of gases;
   (c) exposing the device, coated with the first reactant, to a gaseous second reactant under a plasma treatment, wherein the layer deposited by the first reactant is treated; and
   (d) repeating steps (a)–(c) until the thin film comprising a plurality of layers is deposited.
2. The process of claim 1, wherein the device is a wafer.
3. The process of claim 1, wherein the plasma treatment enhances or maintains the thin film density or conformality.
4. The process of claim 1, wherein the plasma is a high density plasma with higher than $5 \times 10^9$ ion/cm$^3$.
5. The process of claim 1, wherein one of the reactants comprises a metal organic reactant.
6. The process of claim 1, wherein one of the reactants comprises an organic reactant.
7. The process of claim 1, wherein the thin film comprises a metal film.
8. The process of claim 1, wherein the thin film comprises a metal nitride film or a metal oxide film.
9. The process of claim 1, wherein the second reactant is exposed under high pressure above approximately one hundred millitorr (100 mT).
10. The process of claim 1, further comprising pressurizing the chamber to a high pressure above approximately one hundred millitorr (100 mT).
11. The process of claim 1, wherein the first and second reactants react.
12. The process of claim 11, wherein the reaction creates a new compound.
13. The process of claim 1, wherein the thin film thickness is between a fraction of a nanometer and ten nanometers.
14. The process of claim 1, further comprising sequentially pulsing the plasma for each layer to be deposited.
15. The process of claim 1, further comprising exciting the plasma with a solid state RF plasma source.
16. The process of claim 1, further comprising purging a chamber containing the device.
17. A process to deposit a thin film by chemical vapor deposition, comprising:
   (a) pre-cleaning a surface of a device;
   (b) evacuating a chamber of gases;
   (c) stabilizing precursor flow and pressure;
   (d) exposing the device to a gaseous first reactant, wherein the first reactant deposits on the device to form a layer having a thickness of more than a monolayer;
   (e) purging the chamber;
   (f) evacuating the chamber of gases;
   (g) striking the plasma;
   (h) performing a plasma treatment for the deposition;
   (i) exposing the device, coated with the first reactant, to a gaseous second reactant under the plasma treatment, the layer deposited by the first reactant is treated; and
   (j) repeating steps (c)–(i) until the thin film comprising a plurality of layers is deposited.
18. An apparatus to perform nano-layer deposition (NLD), comprising:
   a high density inductive coupled plasma generator to generate plasma; and
   a process chamber housing the plasma generator, wherein the chamber exposes a device to a gaseous first reactant, wherein the first reactant deposits on the device to form a layer having a thickness of more than a monolayer and, after purging, exposes the device, coated with the first reactant, to a gaseous second reactant under plasma, the layer deposited by the first reactant is treated.
19. A process to deposit a thin film on a device by chemical vapor deposition, comprising:
   evacuating a chamber of gases;
   (a) exposing a device to a gaseous first reactant, wherein the first reactant deposits on the device to form a layer;
   (b) evacuating the chamber of gases;
   (c) exposing the device, coated with the first reactant, to a gaseous second reactant under a plasma treatment, wherein the plasma is generated with a solid state RF plasma source having a helical ribbon electrode, wherein the layer deposited by the first reactant is treated; and
   (d) repeating steps (a)–(c) until the thin film comprising a plurality of layers is deposited.
20. An apparatus to perform nano-layer deposition (NLD), comprising:
   a high density inductive coupled plasma generator to generate plasma, the plasma generator comprising a solid state RF plasma source with a helical ribbon electrode; and
   a process chamber housing the plasma generator, wherein the chamber exposes a device to a gaseous first reactant, wherein the first reactant deposits on the device to form a layer and, after purging, exposes the device, coated with the first reactant, to a gaseous second reactant under plasma, the layer deposited by the first reactant is treated.

* * * * *